United States Patent
Takikawa et al.

(10) Patent No.: US 11,929,237 B2
(45) Date of Patent: Mar. 12, 2024

(54) PLASMA GENERATION DEVICE AND PLASMA HEAD COOLING METHOD

(71) Applicant: FUJI CORPORATION, Chiryu (JP)

(72) Inventors: Shinji Takikawa, Anjo (JP); Tomoko Higashida, Chiryu (JP); Takahiro Jindo, Anjo (JP)

(73) Assignee: FUJI CORPORATION, Chiryu (JP)

( * ) Notice: Subject to any disclaimer, the term of this patent is extended or adjusted under 35 U.S.C. 154(b) by 525 days.

(21) Appl. No.: 17/265,743

(22) PCT Filed: Aug. 28, 2018

(86) PCT No.: PCT/JP2018/031651
§ 371 (c)(1),
(2) Date: Feb. 3, 2021

(87) PCT Pub. No.: WO2020/044422
PCT Pub. Date: Mar. 5, 2020

(65) Prior Publication Data
US 2021/0166919 A1    Jun. 3, 2021

(51) Int. Cl.
*H01J 37/32*    (2006.01)

(52) U.S. Cl.
CPC .. *H01J 37/32449* (2013.01); *H01J 37/32568* (2013.01); *H01J 37/32724* (2013.01); *H01J 37/32825* (2013.01)

(58) Field of Classification Search
CPC ........... H01J 37/32449; H01J 37/32568; H01J 37/32724; H01J 37/32825; H05H 1/3494; H05H 2242/10; H05H 1/466; H05H 1/28
See application file for complete search history.

(56) References Cited

U.S. PATENT DOCUMENTS

| | | | |
|---|---|---|---|
| 2007/0235432 A1 | 10/2007 | Schneider | |
| 2010/0006543 A1* | 1/2010 | Sawada | H01J 37/32091 156/345.43 |

(Continued)

FOREIGN PATENT DOCUMENTS

| | | | | |
|---|---|---|---|---|
| CN | 105386012 A | * | 3/2016 | ....... C23C 16/45527 |
| CN | 106922071 A | * | 7/2017 | |

(Continued)

OTHER PUBLICATIONS

International Search Report dated Oct. 30, 2018 in PCT/JP2018/031651 filed on Aug. 28, 2018, 2 pages.

*Primary Examiner* — Abdullah A Riyami
*Assistant Examiner* — Syed M Kaiser
(74) *Attorney, Agent, or Firm* — Oblon, McClelland, Maier & Neustadt, L.L.P.

(57) ABSTRACT

A plasma generation device includes a plasma head configured to eject plasma gas that is plasmatized, a gas supply device configured to supply gas serving as the plasma gas to the plasma head, a pair of electrodes that is provided in the plasma head, the pair of electrodes being configured to perform discharging for a part of the gas supplied from the gas supply device to generate the plasma gas, a temperature sensor that is provided in the plasma head, the temperature sensor being configured to measure a temperature of the plasma head; and a control device, in which the control device executes a cooling process of cooling the plasma head by causing the gas supply device to continue supply of the gas until the temperature sensor measures a temperature equal to or less than a predetermined value after the discharging of the pair of electrodes is stopped.

6 Claims, 8 Drawing Sheets

(56) References Cited

U.S. PATENT DOCUMENTS

2015/0069911 A1 3/2015 Nettesheim et al.
2015/0283640 A1 10/2015 Walker

FOREIGN PATENT DOCUMENTS

| JP | WO2014/188592 A1 | 11/2014 | |
|----|------------------|---------|---|
| WO | WO-2015132853 A1 * | 9/2015 | ............... F03H 1/00 |

* cited by examiner

| FIRST TEMPERATURE | LOWER LIMIT TEMPERATURE OF HEATER |
|---|---|
| 0~400°C | FIRST TEMPERATURE + 50°C |
| 400~500°C | FIRST TEMPERATURE + 20°C |
| 500~600°C | FIRST TEMPERATURE + 5°C |
| 600~650°C | FIRST TEMPERATURE + 3°C |

PLASMA GENERATION DEVICE AND PLASMA HEAD COOLING METHOD

TECHNICAL FIELD

The present disclosure relates to a plasma generation device and a plasma head cooling method for cooling a plasma head.

BACKGROUND ART

In the conventional art, regarding a plasma generation device and a plasma head cooling method, various techniques for cooling a plasma head have been proposed.

For example, in an atmospheric-pressure plasma generation device disclosed in Patent Literature 1, the supply of an inert gas to a reaction chamber is stopped on the condition that a set time has elapsed after application of a voltage to electrodes is stopped. In other words, even after the application of the voltage to the electrodes is stopped and discharging disappears, the inert gas is supplied to the reaction chamber for the set time. Consequently, it is possible to prevent oxidation of the electrodes.

PATENT LITERATURE

Patent Literature 1: International Publication No. WO 2014/188592

BRIEF SUMMARY

Technical Problem

Thereafter, when a body including the electrodes and the reaction chamber is cooled, the maintenance by a user becomes possible, but it is desirable that the body is cooled more preferably.

Therefore, the present disclosure has been made in light of the circumstances, and an object thereof is to provide a plasma generation device and a plasma head cooling method capable of appropriately cooling a plasma head.

Solution to Problem

The present specification discloses a plasma generation device including a plasma head configured to eject plasma gas that is plasmatized; a gas supply device configured to supply gas serving as the plasma gas to the plasma head; a pair of electrodes, being provided in the plasma head, which is configured to perform discharging to a part of the gas supplied from the gas supply device so as to generate the plasma gas; a temperature sensor, being provided in the plasma head, which is configured to measure a temperature of the plasma head; and a control device, wherein the control device executes a cooling process of cooling the plasma head by causing the gas supply device to continue supply of the gas until the temperature sensor measures a temperature equal to or less than a predetermined value after the discharging of the pair of electrodes is stopped.

Advantageous Effects

According to the present disclosure, the plasma generation device can appropriately cool the plasma head.

DESCRIPTION OF EMBODIMENTS

Overall Configuration

Figure 9:
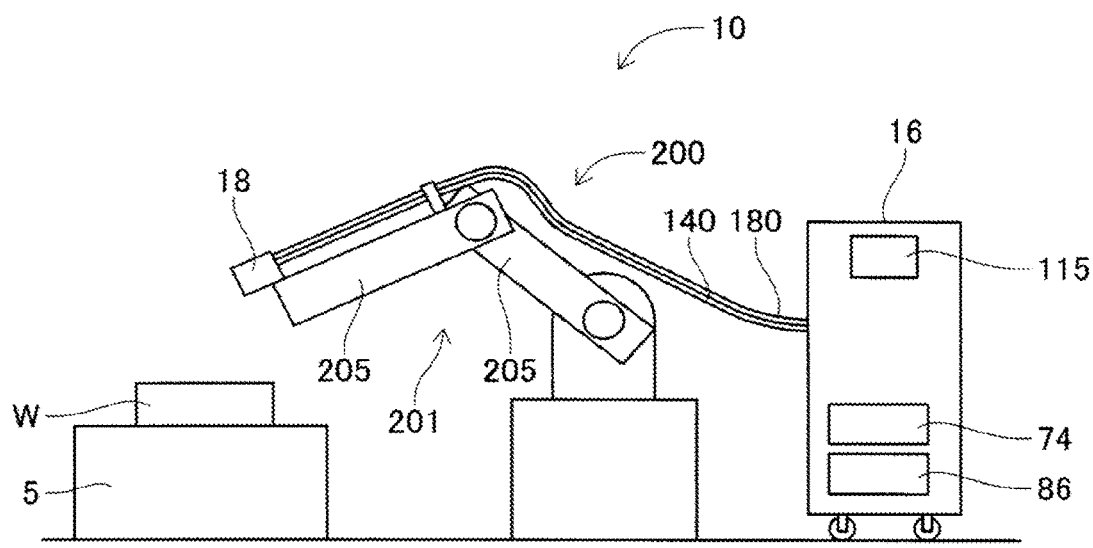
FIG. 9 is a diagram illustrating a schematic configuration of the atmospheric-pressure plasma generation device attached to an industrial robot.

An atmospheric-pressure plasma generation device is a device generating plasma under the atmospheric pressure. As illustrated in FIG. 9, atmospheric-pressure plasma generation device 10 includes plasma head 18, control device 16, power cable 140, gas pipe 180, and the like. Atmospheric-pressure plasma generation device 10 transmits power from control device 16 to plasma head 18 via power cable 140, and supplies a treatment gas or the like via gas pipe 180 to apply plasma gas from plasma head 18. Plasma head 18 is attached to a tip of robot arm 201 of industrial robot 200. Power cable 140 and gas pipe 180 are attached to robot arm 201. Robot arm 201 is an articulated robot in which two arm sections 205 and 205 are connected in one direction. Industrial robot 200 moves plasma head 18 by driving robot arm 201, and performs work of irradiating workpiece W supported by work table 5 with a plasma gas. Control device 16 includes treatment gas supply device 74 and heating gas supply device 86. Treatment gas supply device 74 supplies at least one of an inert gas such as nitrogen and an active gas such as oxygen as a treatment gas. Heating gas supply device 86 supplies an active gas such as oxygen or an inert gas such as nitrogen. Control device 16 includes display device 115. Display device 115 has a screen on which various types of information and the like are displayed.

Configuration of Plasma Head 18

Figure 1:
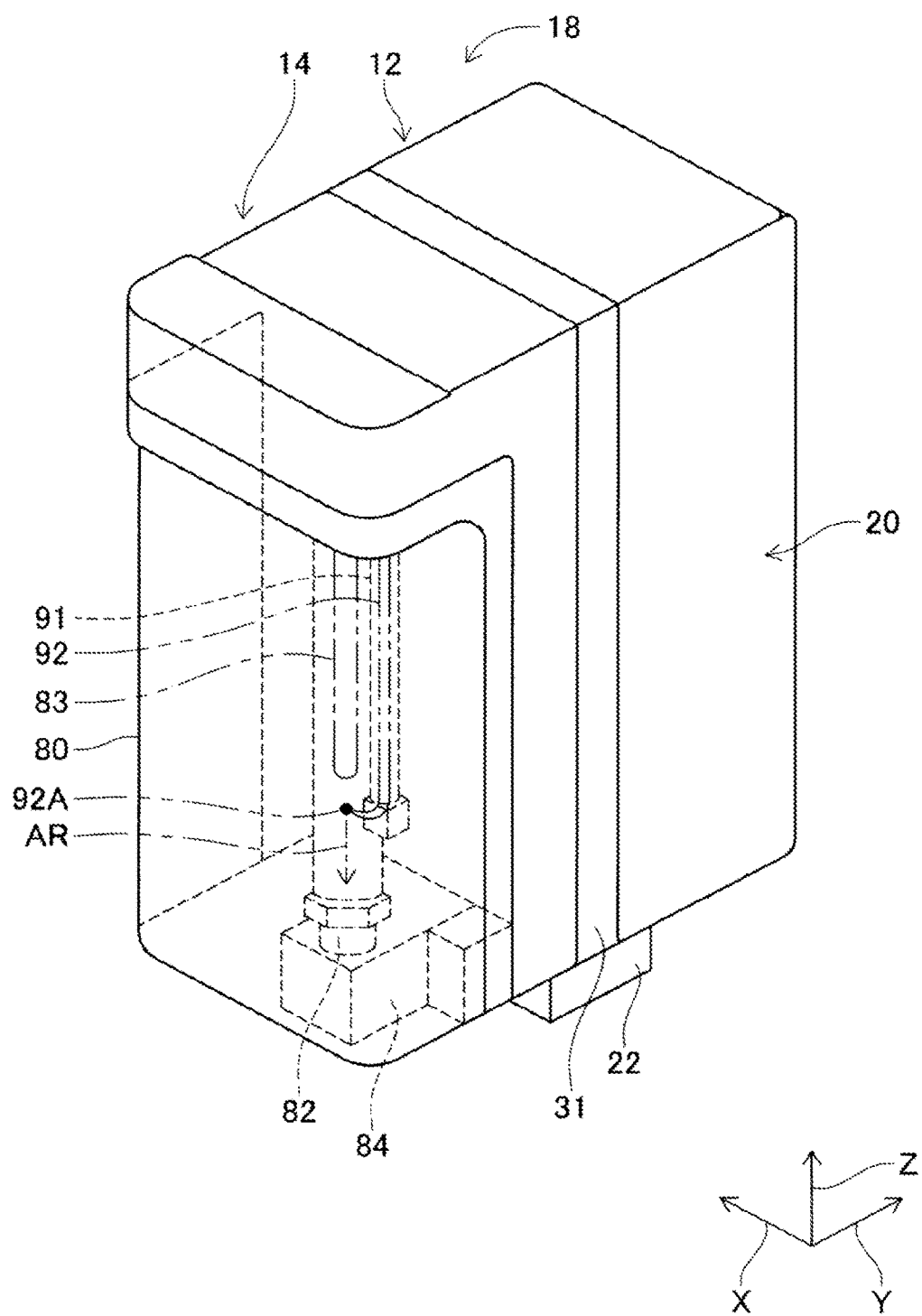
FIG. 1 is a perspective view illustrating a plasma head of an atmospheric-pressure plasma generation device.

As illustrated in FIG. 1, plasma head 18 includes plasma gas ejection device 12 and heated gas ejection device 14. In the following description, a width direction of plasma head 18 is set to an X direction, a depth direction of plasma head 18 is set to a Y direction, and a direction perpendicular to the X direction and the Y direction, that is, a vertical direction is set to a Z direction.

Figure 3:
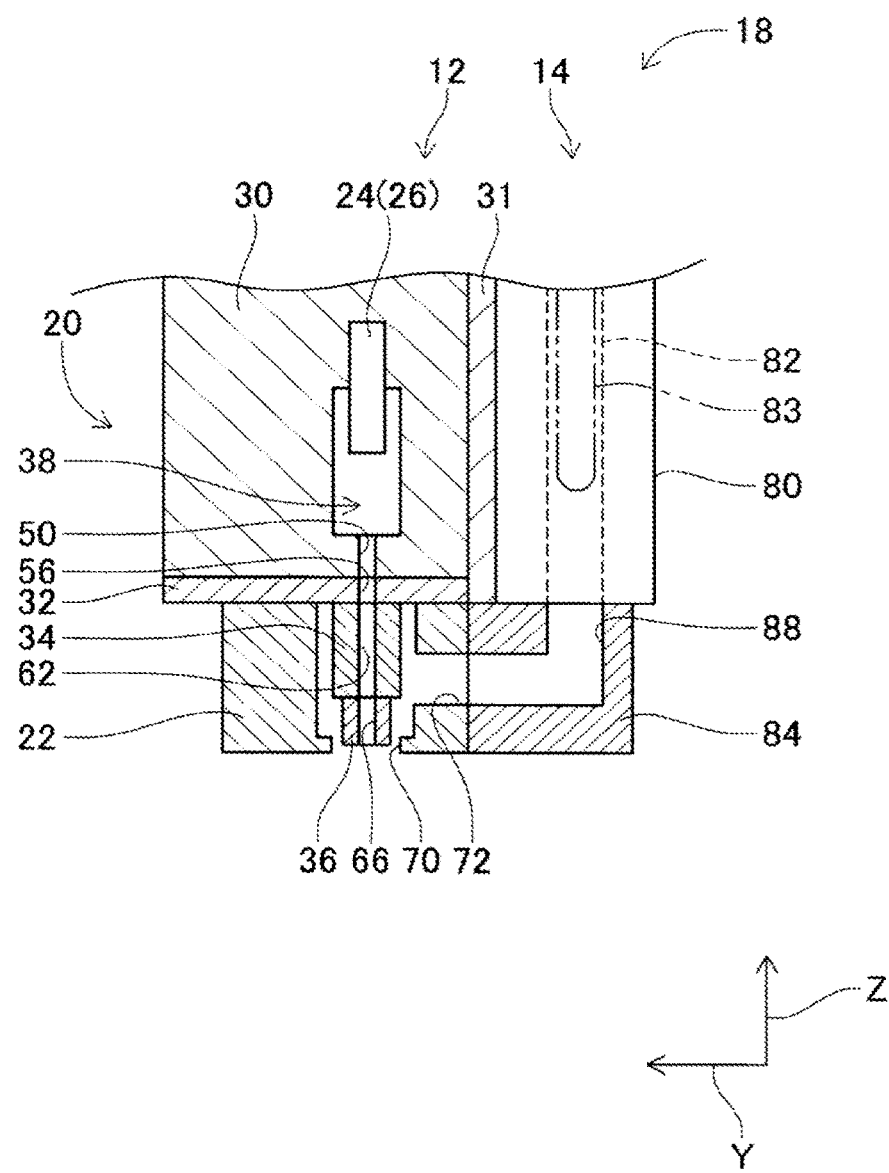
FIG. 3 is a sectional view illustrating a main section of the plasma head of the atmospheric-pressure plasma generation device.

Plasma gas ejection device 12 includes housing 20, cover 22, and pair of electrodes (refer to FIGS. 3 and 4) 24 and 26. As illustrated in FIG. 3, housing 20 includes main housing 30, heat sink 31, ground plate 32, lower housing 34, and nozzle block 36. Main housing 30 generally has a block shape, and reaction chamber 38 is formed inside main housing 30. Main housing 30 is provided with multiple first gas flow paths (in FIG. 3, only one first gas flow path is illustrated) 50 extending in the vertical direction, and multiple first gas flow paths 50 are arranged at predetermined intervals in the X direction (in FIG. 3, a direction perpendicular to the drawing surface). An upper end of each of first gas flow paths 50 is open to reaction chamber 38, and a lower end thereof is open to a bottom surface of main housing 30.

Heat sink 31 is disposed on one side surface of main housing 30 in the Y direction. Heat sink 31 has multiple fins (not illustrated), to radiate heat of main housing 30. Ground plate 32 functions as a lightning rod and is fixed to the lower surface of main housing 30. Ground plate 32 is provided with multiple through-holes 56, corresponding to multiple first gas flow paths 50, penetrating in the vertical direction, and each through-hole 56 is connected to corresponding first gas flow path 50.

Lower housing 34 has a block shape and is fixed to the lower surface of ground plate 32. Lower housing 34 is provided with multiple second gas flow paths 62 extending in the vertical direction, corresponding to multiple through-holes 56. An upper end of each second gas flow path 62 is connected to corresponding through-hole 56, and a lower end thereof is open to the bottom surface of lower housing 34.

Figure 2:
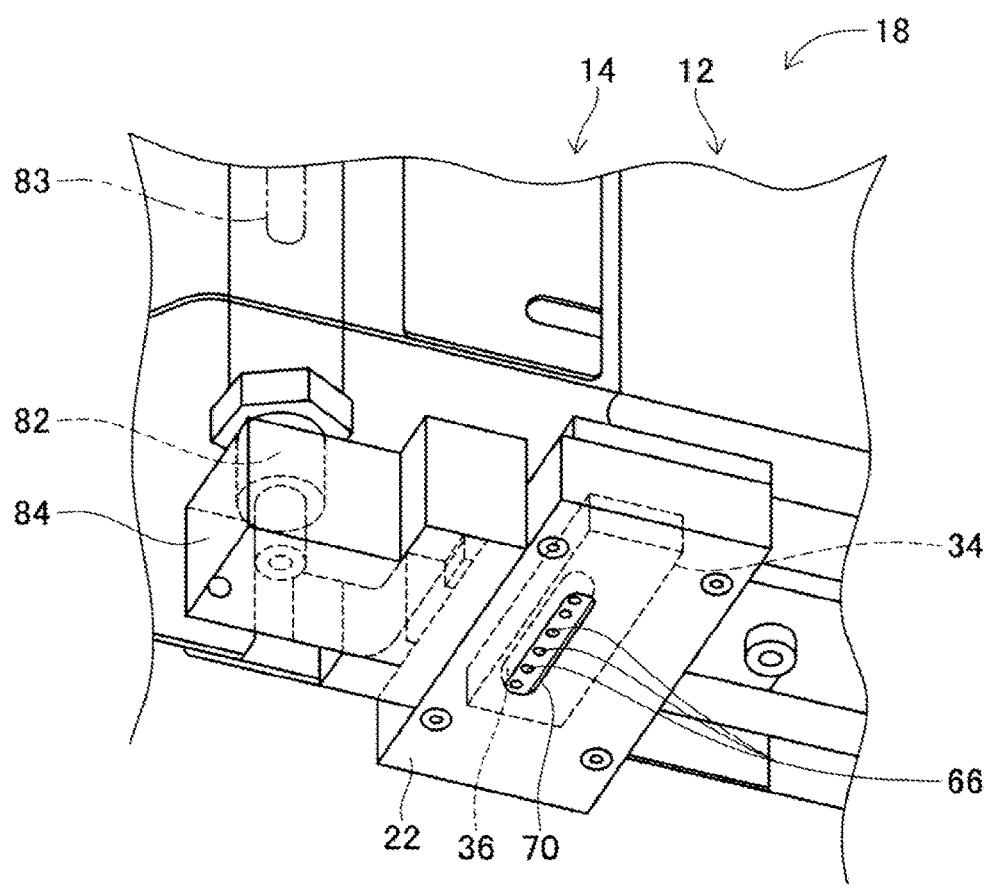
FIG. 2 is a perspective view illustrating a lower end of a plasma head of the atmospheric-pressure plasma generation device.
Figure 2:
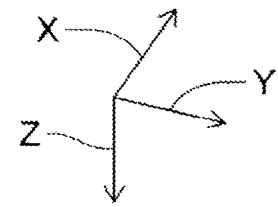

As illustrated in FIG. 2, nozzle block 36 is fixed to the lower surface of lower housing 34, and is provided with multiple third gas flow paths 66 extending in the vertical direction, corresponding to multiple second gas flow paths 62 of lower housing 34. An upper end of each third gas flow path 66 is connected to corresponding second gas flow path 62, and a lower end thereof is open to the bottom surface of nozzle block 36.

Referring to FIG. 3 again, cover 22 has generally a square shape and is disposed on the lower surface of ground plate 32 to cover lower housing 34 and nozzle block 36. Through-hole 70 is formed in the lower surface of cover 22. Through-hole 70 is larger than the lower surface of nozzle block 36, and the lower surface of nozzle block 36 is located in through-hole 70. Through-hole 72 extending in the Y direction is formed on the side surface of cover 22 on heated gas ejection device 14 side.

Pair of electrodes 24 and 26 are disposed to face each other inside reaction chamber 38 of main housing 30. Reaction chamber 38 is connected to treatment gas supply device (refer to FIG. 4) 74 via gas pipe 180 illustrated in FIG. 9. As described above, treatment gas supply device 74 is a device supplying at least one of an inert gas such as nitrogen and an active gas such as oxygen as a treatment gas. Consequently, the treatment gas is supplied to reaction chamber 38 The treatment gas may be a dry air.

Heated gas ejection device 14 includes protection cover 80, gas pipe 82, heater 83, connection block 84. Protection cover 80 is disposed to cover heat sink 31 of plasma gas ejection device 12. Gas pipe 82 is disposed to extend in the vertical direction inside protection cover 80, and gas pipe 82 is connected to heating gas supply device (refer to FIG. 4) 86 via gas pipe 180 illustrated in FIG. 9. However, gas pipe 180 is formed of two different tubes, and includes a tube connected to reaction chamber 38 and treatment gas supply device 74, and a tube connected to gas pipe 82 and heating gas supply device 86. As described above, heating gas supply device 86 is a device supplying an active gas such as oxygen or an inert gas (hereinafter, referred to as a gas) such as nitrogen. Consequently, gas is supplied into gas pipe 82 from heating gas supply device 86, and the gas flows downward. For example, a generally coiled heater 83 is suspended in gas pipe 82. Consequently, the gas supplied from heating gas supply device 86 to gas pipe 82 is heated.

As illustrated in FIG. 1, generally cylindrical thermo-couple cover 91 is provided in gas pipe 82 in a longitudinal direction (that is, the vertical direction) of gas pipe 82.

Thermo-couple 92 is inserted into thermo-couple cover 91. Temperature measurement contact 92A of thermo-couple 92 is inserted into gas pipe 82 from the lower end of thermo-couple cover 91 is disposed under heater 83. Arrow AR illustrated in FIG. 1 indicates a direction in which the gas flows in gas pipe 82. Therefore, thermo-couple 92 measures the temperature of the gas flowing through gas pipe 82 at a position close to heater 83 from the downstream side of the gas in gas pipe 82. In atmospheric-pressure plasma generation device 10, the temperature measured by thermo-couple 92 is handled as the temperature of heater 83 or the temperature of plasma head 18.

Referring to FIG. 3 again, connection block 84 is connected to the lower end of gas pipe 82 and is also fixed to the side surface of cover 22 on heated gas ejection device 14 side in the Y direction. Connection block 84 is provided with communication passage 88 that is bent in a generally L-shaped, and one end of communication passage 88 is open to the upper surface of connection block 84 and the other end of communication passage 88 is open to the side surface of connection block 84 on plasma gas ejection device 12 side. One end of communication passage 88 communicates with gas pipe 82, and the other end of communication passage 88 communicates with through-hole 72 of cover 22. Plasma gas ejection device 12 may not include ground plate 32.

Control System of Atmospheric-Pressure Plasma Generation Device

Figure 4:
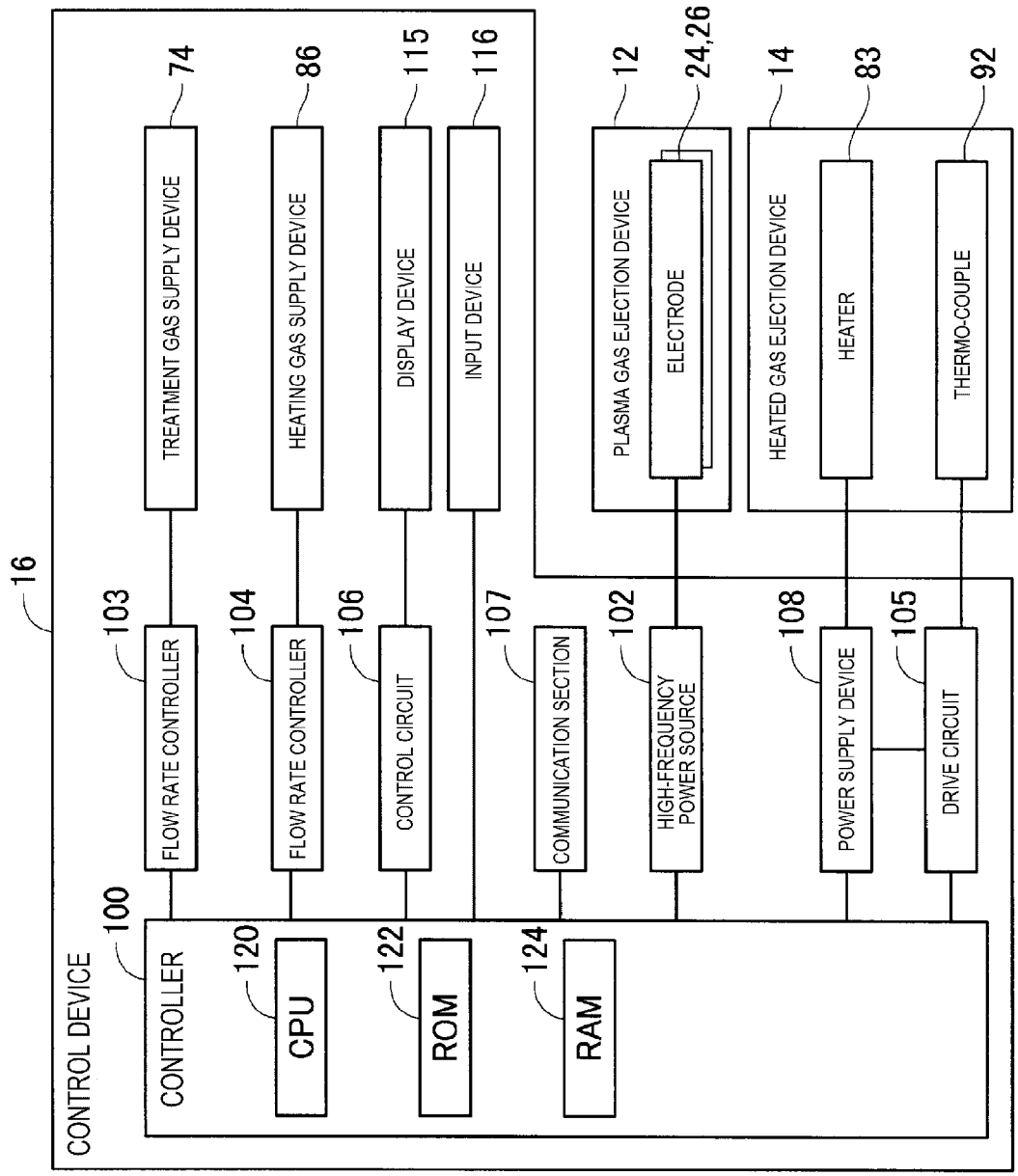
FIG. 4 is a block diagram illustrating a control system of the atmospheric-pressure plasma generation device.

Next, a control system of atmospheric-pressure plasma generation device 10 will be described. Atmospheric-pressure plasma generation device 10 includes control device 16 as illustrated in FIG. 9 described above. As illustrated in FIG. 4, control device 16 includes not only above-described treatment gas supply device 74, heating gas supply device 86, and display device 115 but also controller 100, high-frequency power source 102, drive circuit 105, flow rate controllers 103 and 104, control circuit 106, communication section 107, power supply device 108, and input device 116. Controller 100 is implemented by a computer or the like including CPU 120, ROM 122, RAM 124, and the like. Controller 100 controls plasma gas ejection device 12 and heated gas ejection device 14 by controlling high-frequency power source 102, drive circuit 105, and flow rate controllers 103 and 104. Controller 100 is connected to display device 115 via control circuit 106. Consequently, an image is displayed on display device 115 in response to a command from controller 100. Controller 100 is connected to input device 116. Input device 116 includes operation buttons and the like, and outputs operation information corresponding to an operation on the operation buttons. Thus, the operation information corresponding to the operation on the operation buttons is input to controller 100. Communication section 107 performs communication with a communication apparatus connected to a network (not illustrated). A communication form is not particularly limited and is, for example, a LAN or serial communication.

High-frequency power source 102 generates high-frequency AC power to be supplied to electrodes 24 and 26 by using a commercial power source (not illustrated), and supplies the generated AC power to electrodes 24 and 26.

Flow rate controller 103 is implemented by, for example, a mass flow controller or the like. Flow rate controller 103 controls a flow rate of the treatment gas supplied from treatment gas supply device 74 to reaction chamber 38. Flow rate controller 103 outputs a value of the flow rate of the supplied treatment gas to controller 100.

In the same manner as flow rate controller 103, flow rate controller 104 controls a flow rate of gas supplied from heating gas supply device 86 to gas pipe 82. Flow rate controller 103 outputs a value of the flow rate of the supplied gas to controller 100.

Power supply device 108 and thermo-couple 92 that is attached near the lower end of heater 83 are electrically connected to drive circuit 105. Power supply device 108 supplies AC power generated by using the commercial power source (not illustrated) to heater 83. Drive circuit 105 heats heater 83 and performs temperature adjustment on heater 83 by controlling power supply device 108 based on an output value from thermo-couple 92 such that a target temperature for which an instruction is given from controller 100 is obtained. Drive circuit 105 outputs a temperature corresponding to the output value from thermo-couple 92 to controller 100.

Plasma Treatment Using Atmospheric-Pressure Plasma Generation Device

In atmospheric-pressure plasma generation device 10, in plasma gas ejection device 12, a treatment gas is plasmatized in reaction chamber 38 by the above-described configuration, and the plasma gas is ejected from the lower end of third gas flow path 66 of nozzle block 36. Gas heated by heated gas ejection device 14 is supplied to the inside of cover 22. The plasma gas is ejected from through-hole 70 of cover 22 together with the heated gas, and thus workpiece W is subjected to plasma treatment.

Specifically, in plasma gas ejection device 12, the treatment gas is supplied to reaction chamber 38 by treatment gas supply device 74. In this case, in reaction chamber 38, power is supplied to pair of electrodes 24 and 26, and thus a current flows between pair of electrodes 24 and 26. Consequently, discharging occurs between pair of electrodes 24 and 26, and thus the treatment gas is plasmatized due to the discharging, so that plasma gas is generated. The plasma gas generated in reaction chamber 38 flows downward in first gas flow path 50, and flows into second gas flow path 62 via through-hole 56. The plasma gas flows downward in second gas flow path 62 and third gas flow path 66. Consequently, the plasma gas passes through through-hole 70 of cover 22 to be ejected from the lower end of third gas flow path 66.

In heated gas ejection device 14, gas is supplied to gas pipe 82 by heating gas supply device 86, and the gas supplied to gas pipe 82 is heated by heater 83. Consequently, the gas supplied to gas pipe 82 is heated to 600° C. to 800° C. The gas that has been heated (hereinafter, referred to as a heated gas) flows into cover 22 from through-hole 72 of cover 22 via communication passage 88 of connection block 84. The heated gas flowing into cover 22 is ejected from through-hole 70 of cover 22. In this case, the plasma gas ejected from the lower end of third gas flow path 66 of nozzle block 36 is protected by the heated gas. Consequently, the plasma gas surrounded by the heated gas is discharged from plasma head 18, and plasma treatment can be performed appropriately.

Specifically, during plasma treatment, workpiece W is placed at a position by a predetermined distance from through-hole 70 ejecting the plasma gas, and the plasma gas is ejected onto workpiece W from through-hole 70. That is, during the plasma treatment, the plasma gas is ejected into the air, and workpiece W is irradiated with the plasma gas ejected into the air.

When an instruction for starting plasma generation is received via input device 116, controller 100 starts plasma generation control. In the plasma generation control, controller 100 causes high-frequency power source 102 to start control for supplying predetermined power to electrodes 24 and 26, and thus flow rate controllers 103 and 104 start to respectively supply a treatment gas and gas at predetermined gas flow rates. Controller 100 causes drive circuit 105 to start control of heater 83 such that a predetermined temperature is obtained.

Warming-Up Operation of Heater in Atmospheric-Pressure Plasma Generation Device as described above, in atmospheric-pressure plasma generation device 10, when the plasma treatment is performed on workpiece W, the gas supplied to gas pipe 82 is heated to 600° C. to 800° C. by heater 83. Therefore, at the time of starting of atmospheric-pressure plasma generation device 10, the warming-up operation of heater 83 is performed. During the warming-up operation of heater 83, for example, in a case where thermo-couple 92 fails due to a short circuit or disconnection or the like, a measured temperature of thermo-couple 92 indicates a room temperature at all times or indicates a constant temperature without increasing from a predetermined temperature, and thus an accurate temperature of heater 83 cannot be measured by thermo-couple 92. Thus, there is concern that the temperature of heater 83 is not adjustable, and thus heater 83 fails. Therefore, atmospheric-pressure plasma generation device 10 monitors a temperature rise process of heater 83 during the warming-up operation of heater 83. Next, details thereof will be described.

Figure 5:
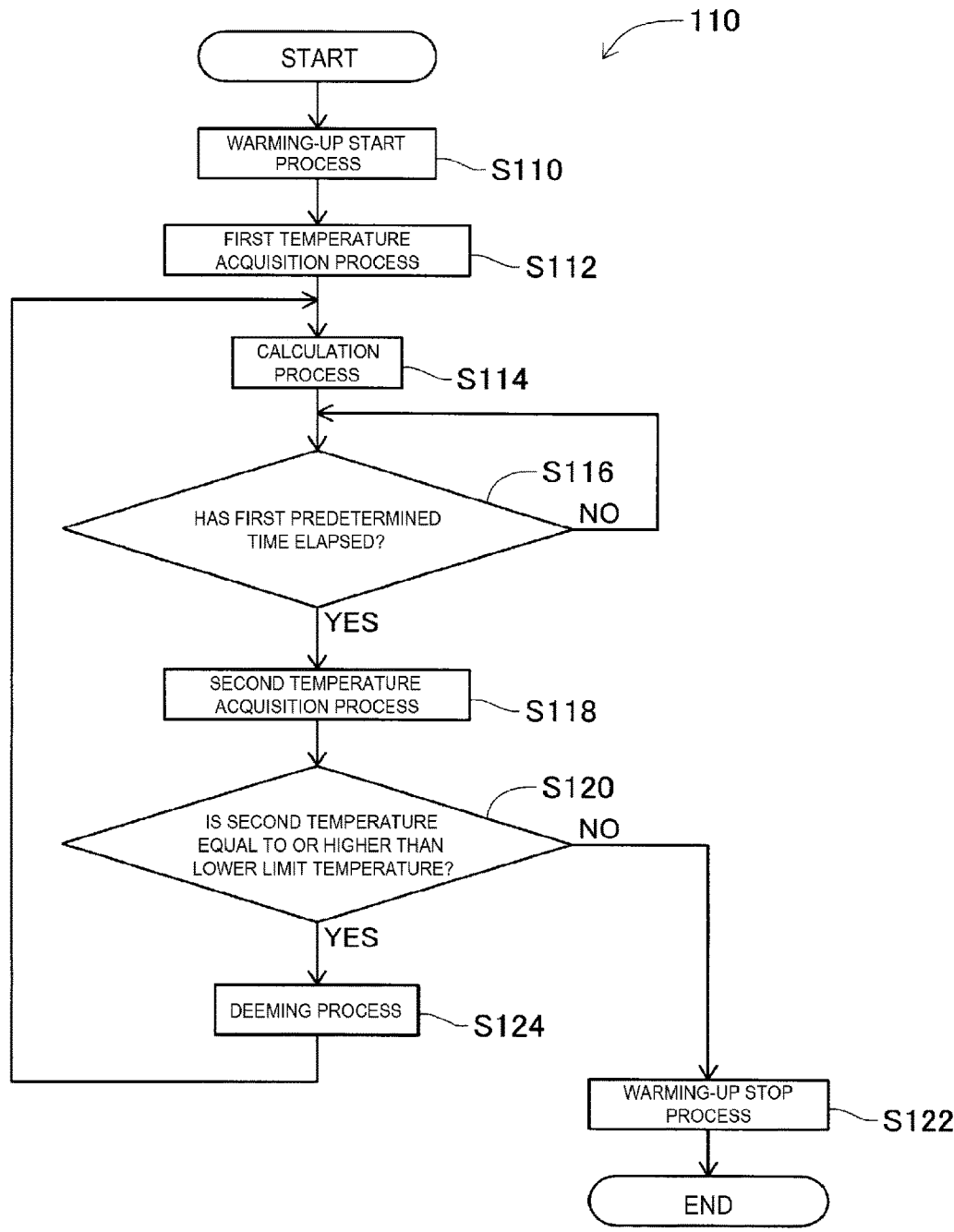
FIG. 5 is a flowchart illustrating a control program for a heater warming-up method.

FIG. 5 is a flowchart illustrating a heater warming-up method 110 for monitoring the temperature rise process of heater 83. The control programs illustrated in the flowchart of FIG. 5 are stored in ROM 122 of controller 100, and are executed by CPU 120 of controller 100 when the user performs predetermined operations with input device 116 at the time of starting atmospheric-pressure plasma generation device 10 or the like.

Figures 6, 7:
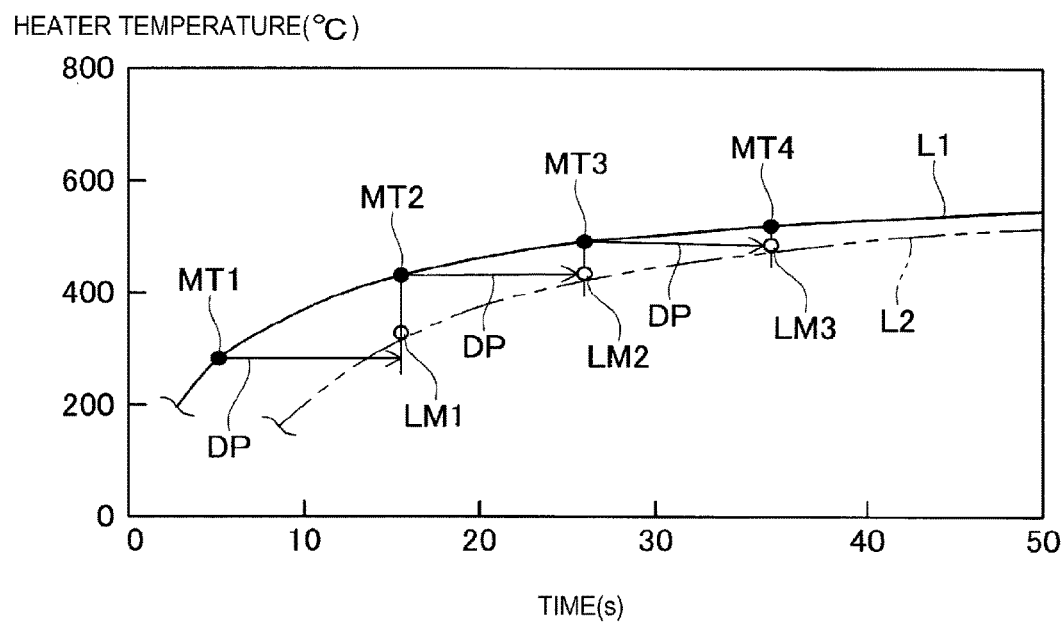
FIG. 6 is a diagram illustrating an example of a temperature rise process of the heater during a warming-up operation.
FIG. 7 is a diagram illustrating an example of a correspondence relationship between a first temperature and a lower limit temperature of the heater.

Hereinafter, each process illustrated in a flowchart of FIG. 5 will be described with reference to FIG. 6 and FIG. 7 along with FIG. 4 described above. Curve L1 in FIG. 6 indicates an example of a temperature change of heater 83 during a warming-up operation. Data table DT in FIG. 7 is stored in ROM 122 of controller 100.

When heater warming-up method 110 is executed, first, warming-up start process S110 is performed. In this process, the warming-up operation of heater 83 is started due to starting of the supply of power from power supply device 108 to heater 83.

Next, first temperature acquisition process S112 is performed. In this process, temperature MT1 is acquired as a first temperature by thermo-couple 92.

Next, calculation process S114 is performed. In this process, lower limit temperature LM1 of heater 83 is calculated. Lower limit temperature LM1 of heater 83 is a temperature of heater 83 during the temperature rise due to the warming-up operation, and refers to the minimum temperature of heater 83 which is supposed by considering an allowable variation range of power supply device 108 at a point in time at which first predetermined time DP (for example, 10 seconds) has elapsed from a point in time at which temperature MT1 is acquired as the first temperature. In the following description, the point in time at which first predetermined time DP has elapsed from the point in time at which the first temperature is acquired may be referred to as a reference point in time.

Lower limit temperature LM1 of heater 83 is calculated based on the first temperature and data table DT.

According to data table DT, for the first temperature that is equal to or higher than 0° C. and lower than 400° C., a temperature obtained by adding 50° C. to the first temperature is calculated as the lower limit temperature of heater 83. Hereinafter, as the lower limit temperature of heater 83, a temperature obtained by adding 20° C. to the first temperature is calculated for the first temperature that is equal to or higher than 400° C. and lower than 500° C., a temperature obtained by adding 5° C. to the first temperature is calculated for the first temperature that is equal to or higher than 500° and lower than 600° C., and a temperature obtained by adding 3° C. to the first temperature is calculated for the first temperature that is equal to or higher than 600° C. and lower than 650° C. Therefore, data table DT is a data table in which a temperature range that classifies the first temperature (in FIG. 7, 0° C. or higher to lower than 400° C., 400° C. or higher to lower than 500° C., 500° C. or higher to lower than 600° C., and 600° C. or higher to lower than 650° C.) is correlated with a temperature difference from the first temperature to the lower limit temperature (in FIG. 7, 50° C., 20° C., 5° C., and 3° C.).

In the above-described way, lower limit temperatures LM1 of heater 83 is calculated based on the data stored in data table DT. When lower limit temperature LM1 of heater 83 is calculated, the flow waits until first predetermined time DP has elapsed from point in time at which temperature MT1 is acquired as the first temperature, that is, until the reference point in time is reached (S116: NO). When first predetermined time DP has elapsed from the point in time at which temperature MT1 is acquired as the first temperature (S116: YES), that is, when the reference point in time is reached, second temperature acquisition process S118 is performed. In this process, temperature MT2 is acquired as a second temperature by thermo-couple 92.

Next, it is determined whether temperature MT2 acquired as the second temperature is equal to or higher than lower limit temperature LM1 (S120). Here, in a case where temperature MT2 acquired as the second temperature is lower than lower limit temperature LM1 (S120: NO), it can be said that temperature MT2 (that is, the temperature of heater 83) acquired as the second temperature does not rise to lower limit temperature LM1 when first predetermined time DP has elapsed from the point in time at which temperature MT1 is acquired as the first temperature, that is, when the reference point in time is reached. Therefore, it is determined that there is an abnormality, and warming-up stop process S122 is performed. In this process, the warming-up operation of heater 83 is stopped by stopping the supply of power from power supply device 108 to heater 83. On the screen of display device 115, for example, the entire region is displayed red, and a message indicating that the warming-up operation has been stopped is displayed. The message indicating that the warming-up operation has been stopped is transmitted to a terminal of an administrator who manages atmospheric-pressure plasma generation device 10 or a terminal of a support desk operated by a supplier of atmospheric-pressure plasma generation device 10 through network communication of communication section 107. Thereafter, heater warming-up method 110 is finished.

On the other hand, in a case where temperature MT2 acquired as the second temperature is equal to or higher than lower limit temperature LM1 (S120: YES), deeming process S124 is performed. In this process, temperature MT2 acquired as the second temperature is handled as the first temperature instead of temperature MT1.

Thereafter, the processes of the above S114, S116, S118, and S120 are repeatedly performed. Thus, in calculation process S114 described above, lower limit temperature LM2 of heater 83 is calculated based on temperature MT2 handled as the first temperature and data table DT. Lower limit temperature LM2 of heater 83 calculated in the above-described way is the same as lower limit temperature LM1 described above. That is, lower limit temperature LM2 of heater 83 is a temperature of heater 83 during the temperature rise due to the warming-up operation, and is the minimum temperature of heater 83 which is supposed by considering an allowable variation range of power supply device 108 at the reference point in time at which first predetermined time DP has elapsed from the point in time at which temperature MT2 handled as the first temperature is acquired.

Then, when first predetermined time DP has elapsed from the point in time at which temperature MT2 handled as the first temperature is acquired (S116: YES), that is, when the reference point in time is reached, second temperature acquisition process S118 described above is performed, and thus temperature MT3 is acquired as the second temperature.

In a case where temperature MT3 acquired as the second temperature is lower than lower limit temperature LM2 (S120: NO), it is determined that there is an abnormality, and the warming-up operation of heater 83 is stopped (S122). In contrast, in a case where temperature MT3 acquired as the second temperature is equal to or higher than lower limit temperature LM2 (S120: YES), deeming process S124 is performed again, and temperature MT3 acquired as the second temperature is handled as the first temperature instead of temperature MT2 (S124).

In the same manner as follows, lower limit temperature LM3 of heater 83 is calculated based on temperature MT3 handled as the first temperature and data table DT (S114), further, when first predetermined time DP has elapsed from the point in time at which temperature MT3 handled as the first temperature is acquired (S116: YES), that is, when the reference point in time is reached, temperature MT4 is acquired as the second temperature (S118). Then, in a case where temperature MT4 acquired as the second temperature is lower than lower limit temperature LM3 (S120: NO), it is determined that there is an abnormality, and the warming-up operation of heater 83 is stopped (S122). In contrast, in a case where temperature MT4 acquired as the second temperature is equal to or higher than lower limit temperature LM3 (S120: YES), temperature MT4 acquired as the second temperature is handled as the first temperature instead of temperature MT3 (S124).

In above-described way, heater warming-up method 110 is continued as long as the second temperature is equal to or higher than a lower limit temperature calculated based on the first temperature.

From the above description, heater warming-up method 110 is executed, and thus atmospheric-pressure plasma generation device 10 can monitor the temperature rise process during the warming-up operation of heater 83 provided in plasma head 18.

Lower limit temperatures LM1, LM2, and LM3 of heater 83 may be calculated from an approximate expression representing a relationship with an elapsed time from a point in time at which the supply of power to heater 83 is started (that is, a warming-up time of heater 83). In FIG. 6, such an approximate expression is represented by curve L2 indicated by a two-dot chain line. A formula representing curved L2 is stored in ROM 122 of controller 100.

In this case, lower limit temperatures LM1, LM2, and LM3 of heater 83 are calculated by assigning the reference point in time at which first predetermined time DP has elapsed from the point in time at which temperatures MT1, MT2, and MT3 acquired or handled as the first temperature are acquired, the reference point in time being a point in time at which an elapsed time from the point in time at which the supply of power to heater 83 is started is measured, to the formula (approximate expression) represented by curved line L2 in FIG. 6.

Even in a case where heater 83 is not provided in plasma head 18, as long as heater 83 warms the plasma applied from plasma head 18, heater 83 may be a target of heater warming-up method 110.

Cooling Operation of Heater in Atmospheric-Pressure Plasma Generation Device

When atmospheric-pressure plasma generation device 10 is stopped after workpiece W is subjected to plasma treatment in atmospheric-pressure plasma generation device 10, controller 100 cools plasma head 18 by continuing the supply of a treatment gas using treatment gas supply device 74 and the supply of gas using heating gas supply device 86. After plasma head 18 is cooled, there is a case where a user touches plasma head 18 for maintenance. Therefore, the cooling of plasma head 18 is continued on the assumption that a surface temperature of plasma head 18 drops to, for example, about 40° C., but in a case where the cooling is performed while the temperature of plasma head 18 is measured again, it is possible to perform the cooling more preferably. Therefore, atmospheric-pressure plasma generation device 10 performs cooling of plasma head 18 while measuring the temperature of plasma head 18. Next, details thereof will be described.

Figure 8:
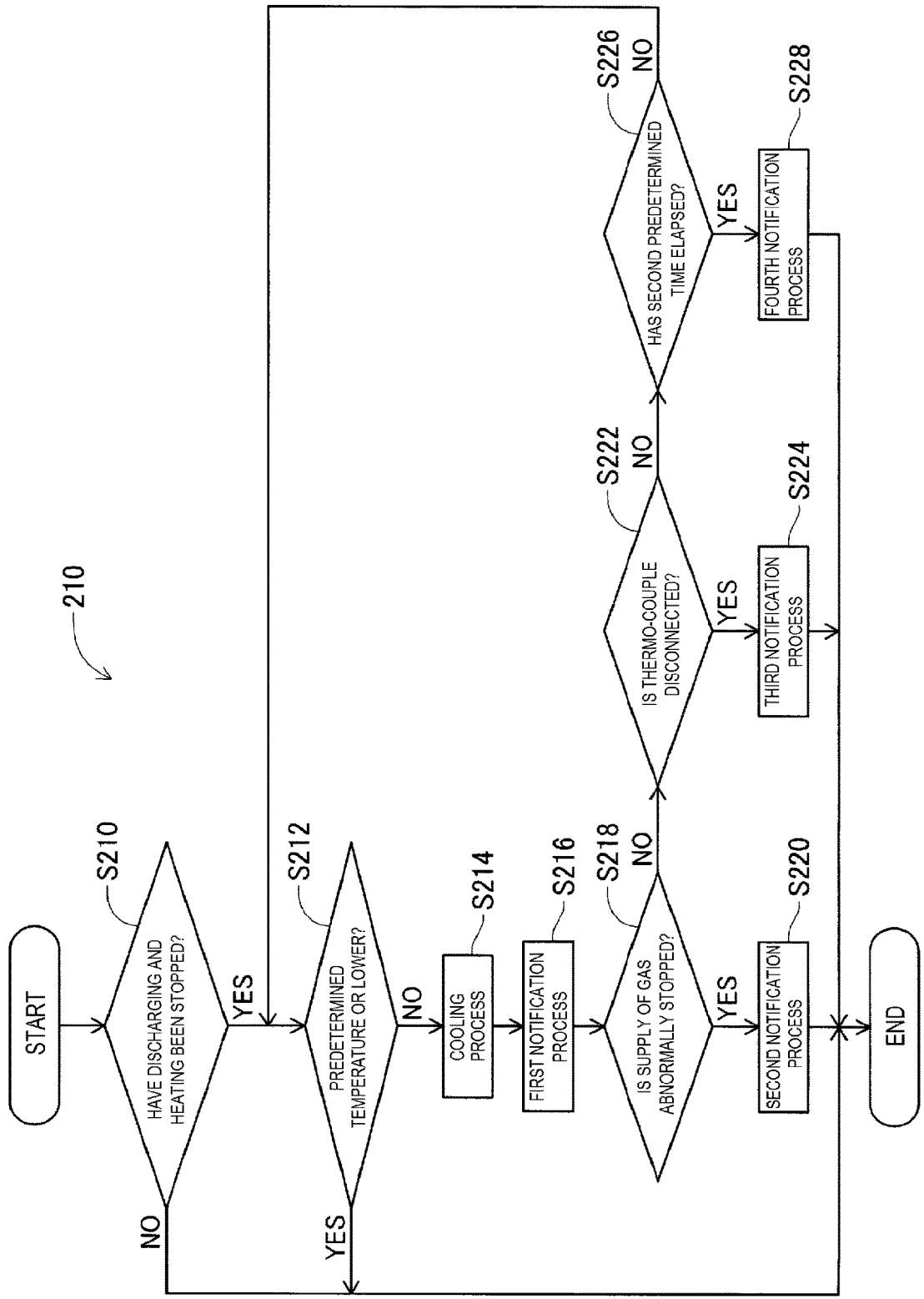
FIG. 8 is a flowchart illustrating a control program for a plasma head cooling method.

FIG. 8 is a flowchart illustrating plasma head cooling method 210 for cooling plasma head 18 while measuring the temperature of plasma head 18. A control program illustrated in the flowchart of FIG. 8 is stored in ROM 122 of controller 100, and is executed by CPU 120 of controller 100 when workpiece W is subjected to plasma treatment by atmospheric-pressure plasma generation device 10. Therefore, when plasma head cooling method 210 is executed, the supply of a treatment gas using treatment gas supply device 74 and the supply of gas using heating gas supply device 86 are performed. Hereinafter, each process illustrated in the flowchart of FIG. 8 will be described.

CPU 120 of controller 100 performs each process illustrated in the flowchart of FIG. 8 by using the temperature of heater 83 measured by thermo-couple 92. The surface of plasma head 18 varies in temperature depending on a position thereof while workpiece W is being subjected to plasma treatment. However, the entire surface region of plasma head 18 tends to converge to the same temperature after a certain time has elapsed since its start of cooling. Therefore, in plasma head cooling method 210 illustrated in the flowchart of FIG. 8, the temperature of heater 83 measured by thermo-couple 92 is used as the temperature of plasma head 18.

When plasma head cooling method 210 is executed, it is determined whether discharging between pair of electrodes 24, 26 and heating of heater 83 have been stopped (S210). This determination is performed based on a signal from high-frequency power source 102, a signal from drive circuit 105, and the like. Here, in a case where discharging between pair of electrodes 24 and 26 or heating of heater 83 is not stopped (S210: NO), plasma head cooling method 210 is finished.

In contrast, in a case where discharging between pair of electrodes 24 and 26 or heating of heater 83 is stopped (S210: YES), it is determined whether the temperature of heater 83 measured by thermo-couple 92 is equal to or lower than a predetermined temperature (S212). Here, the predetermined temperature is a temperature at which there is no problem even when the user touches the surface of plasma head 18 (for example, a temperature around 40° C.). Here, in a case where the temperature of heater 83 measured by thermo-couple 92 is equal to or lower than the predetermined temperature (S212: YES), plasma head cooling method 210 is finished.

In contrast, in a case where the temperature of heater 83 measured by thermo-couple 92 is higher than the predetermined temperature (S212: NO), cooling process S214 is performed. In this process, the supply of the treatment gas using treatment gas supply device 74 and the supply of the gas using heating gas supply device 86 are continued.

Next, first notification process S216 is performed. In this process, a message indicating that plasma head 18 is being cooled is displayed on the screen of display device 115. The message indicating that plasma head 18 is being cooled is transmitted to the terminal of the administrator who manages atmospheric-pressure plasma generation device 10 or the terminal of the support desk operated by the supplier of atmospheric-pressure plasma generation device 10 through network communication of communication section 107.

Thereafter, it is determined whether the supply of the treatment gas using treatment gas supply device 74 or the supply of the gas using heating gas supply device 86 is abnormally stopped. This determination is performed based on signals or the like from flow rate controllers 103 and 104. Here, in a case where the supply of the treatment gas using treatment gas supply device 74 or the supply of the gas using heating gas supply device 86 is abnormally stopped (S218: YES), second notification process S220 is performed.

In second notification process S220, a message indicating that the cooling of plasma head 18 is abnormal due to an abnormality in the gas supply is displayed on the screen of display device 115. The message indicating that the cooling of plasma head 18 is abnormal due to the abnormality in the gas supply is transmitted to the terminal of the administrator who manages atmospheric-pressure plasma generation device 10 or the terminal of the support desk operated by the supplier of atmospheric-pressure plasma generation device 10 through network communication of communication section 107. Thereafter, plasma head cooling method 210 is finished.

In contrast, in a case where the supply of the treatment gas using treatment gas supply device 74 or the supply of the gas using heating gas supply device 86 is not abnormally stopped (S218: NO), it is determined whether thermo-couple 92 shows an abnormality such as disconnection (S222). This determination is performed based on an output voltage or the like of thermo-couple 92. Here, in a case where thermo-couple 92 shows an abnormality such as disconnection (S222: YES), third notification process S224 is performed.

In third notification process S224, a message indicating that the cooling of plasma head 18 is abnormal due to an abnormality of thermo-couple 92 is displayed on the screen of display device 115. The message indicating that the cooling of plasma head 18 is abnormal due to an abnormality of thermo-couple is transmitted to the terminal of the administrator who manages atmospheric-pressure plasma generation device 10 or the terminal of the support desk operated by the supplier of atmospheric-pressure plasma generation device 10 through network communication of communication section 107. Thereafter, plasma head cooling method 210 is finished.

On the other hand, when thermo-couple 92 does not show an abnormality such as disconnection (S222: NO), it is determined whether a second predetermined time has elapsed from stoppage of the discharging between pair of electrodes 24 and 26 and the heating of heater 83 (S226). This determination is performed based on an elapsed time measured with reception of a signal from drive circuit 105, a signal from high-frequency power source 102, and the like as a trigger. The second predetermined time is a time (for example, 20 minutes) required for the entire surface of plasma head 18 to be cooled to a temperature (for example, a temperature around 40° C.) at which there is no problem even when the user touches the surface of plasma head 18.

Here, in a case where the second predetermined time has elapsed from stoppage of the discharging between pair of electrodes 24 and 26 and the heating of heater 83 (S226: YES), fourth notification process S228 is performed. In this process, a message indicating that the cooling of plasma head 18 is abnormal is displayed on the screen of display device 115. The message indicating that the cooling of plasma head 18 is abnormal is transmitted to the terminal of the administrator who manages atmospheric-pressure plasma generation device 10 or the terminal of the support desk operated by the supplier of atmospheric-pressure plasma generation device 10 through network communication of communication section 107. The message also includes information indicating that, even when the second predetermined time has elapsed from stoppage of the discharging between pair of electrodes 24 and 26 and the heating of heater 83, the surface temperature of plasma head 18 (more precisely, the temperature of heater 83) is not equal to or lower than the predetermined temperature. Thereafter, plasma head cooling method 210 is finished.

In contrast, in a case where the second predetermined time has not elapsed from stoppage of the discharging between pair of electrodes 24 and 26 and the heating of heater 83 (S226: NO), the flow returns to determination process S212 described above.

Thereafter, as described above, in a case where the temperature of heater 83 measured by thermo-couple 92 is higher than a predetermined temperature (S212: NO), the supply of the treatment gas using treatment gas supply device 74 and the supply of the gas using heating gas supply device 86 are continued (S214), and in a case where the temperature of heater 83 measured by thermo-couple 92 is equal to or lower than the predetermined temperature (S212: YES), plasma head cooling method 210 is finished.

In the above-described way, in plasma head cooling method 210, cooling of plasma head 18 is finished assuming that the surface temperature of plasma head 18 is reduced to a temperature (for example, a temperature around 40° C.) at which there is no problem even when the user touches the surface of plasma head 18 based on the temperature (the temperature measured by thermo-couple 92) of heater 83 used as the temperature of plasma head 18.

As described above, plasma head cooling method 210 is executed, and thus atmospheric-pressure plasma generation device 10 can perform appropriate cooling of plasma head 18 while improving maintenance.

The present disclosure is not limited to the above-described embodiments, and various modifications may occur without departing from the spirit thereof. For example, atmospheric-pressure plasma generation device 10 may be provided with, instead of thermo-couple 92, other sensors capable of measuring the temperature of heater 83 or the temperature of gas flowing in gas pipe 82, for example, a thermistor or an infrared sensor.

Atmospheric-pressure plasma generation device 10 may be provided with a heater heated by a high temperature fluid such as a liquid or gas instead of heater 83 heated by power supply device 108. In this case, the temperature of the heater is adjusted by controlling the temperature or a flow rate of the high temperature fluid.

When plasma head cooling method 210 is finished, the supply of the treatment gas using treatment gas supply device 74 and the supply of the gas using heating gas supply device 86 may be or need not be continued.

Plasma head cooling method 210 may also be executed in a state in which temperature measurement contact 92A of thermo-couple 92 is embedded in, for example, main housing 30 of plasma head 18. In this case, plasma head cooling method 210 may be applied to a case where heated gas ejection device 14 including heater 83 is not provided in plasma head 18.

In the present embodiment, atmospheric-pressure plasma generation device 10 is an example of a plasma generation device. Treatment gas supply device 74 and heating gas supply device 86 are an example of a gas supply device. Thermo-couple 92 is an example of a temperature sensor. Display device 115 is an example of a notification device. The cooling process S214 is an example of a cooling step. First notification process S216, second notification process S220, third notification process S224, and fourth notification process S228 are an example of a notification process. The second predetermined time used in the determination of S226 is an example of a predetermined time.

REFERENCE SIGNS LIST

10 Atmospheric-pressure plasma generation device, 16 Control device, 18 Plasma head, 24 Electrode, 26 Electrode, 74 Treatment gas supply device, 83 Heater, 86 Heating gas supply device, 92 Thermo-couple, 115 Display device, 210 Plasma head cooling method, S214 Cooling process, S216 First notification process, S220 Second notification process, S224 Third notification process, S228 Fourth notification process

The invention claimed is:

1. A plasma generation device comprising:
   a plasma head configured to eject plasma gas that is plasmatized;
   a gas supply device configured to supply gas serving as the plasma gas to the plasma head;
   a pair of electrodes, being provided in the plasma head, which is configured to perform discharging to a part of the gas supplied from the gas supply device so as to generate the plasma gas;
   a temperature sensor, being provided in the plasma head, which is configured to measure a temperature of the plasma head;
   a control device; and,
   a notification device,
   wherein the control device executes a cooling process of cooling the plasma head by causing the gas supply device to continue supply of the gas until the temperature sensor measures a temperature equal to or less than a predetermined value after the discharging of the pair of electrodes is stopped, and
   wherein the control device executes a notification process of causing the notification device to notify that cooling of the plasma head is abnormal when a predetermined time elapses from stoppage of the discharging of the pair of electrodes during the cooling of the plasma head.

2. The plasma generation device according to claim 1, further comprising:

a heater that is provided in the plasma head, the heater being configured to heat a part of the gas supplied from the gas supply device to generate high-temperature gas, wherein the plasma head ejects the high-temperature gas along with the plasma gas, wherein the temperature sensor measures a temperature of the high-temperature gas before the discharging is stopped, and measures a temperature of the heater as the temperature of the plasma head after the discharging is stopped, and wherein the control device executes the cooling process after heating using the heater is stopped in addition to stoppage of the discharging.

3. The plasma generation device according to claim 1, wherein the control device executes a notification process of causing the notification device to notify that cooling of the plasma head is being performed during the cooling of the plasma head.

4. The plasma generation device according to claim 1, wherein the control device executes a notification process of causing the notification device to notify that cooling of the plasma head is abnormal when the supply of the gas using the gas supply device is abnormally stopped during the cooling of the plasma head.

5. The plasma generation device according to claim 2, further comprising:

a gas pipe that is provided with the heater therein, wherein the temperature sensor is a thermo-couple provided in the gas pipe, and the control device executes a notification process of causing the notification device to notify that cooling of the plasma head is abnormal when the thermo-couple shows an abnormality during the cooling of the plasma head.

6. A plasma head cooling method for a plasma generation device including a plasma head that has a pair of electrodes and is supplied with a gas and ejects a plasma gas in which a part of the gas is plasmatized due to discharging of the pair of electrodes, the plasma head cooling method comprising:

cooling the plasma head by continuing supply of the gas until a temperature of the plasma head is equal to or less than a predetermined value after the discharging of the pair of electrodes is stopped; and causing a notification device to notify that cooling of the plasma head is abnormal when a predetermined time elapses from stoppage of the discharging of the pair of electrodes during the cooling of the plasma head.

* * * * *